(12) United States Patent
Saigoh et al.

(10) Patent No.: US 9,059,033 B2
(45) Date of Patent: Jun. 16, 2015

(54) SEMICONDUCTOR DEVICE WITH PADS OF ENHANCED MOISTURE BLOCKING ABILITY

(71) Applicant: FUJITSU SEMICONDUCTOR LIMITED, Yokohama-shi, Kanagawa (JP)

(72) Inventors: Kaoru Saigoh, Kawasaki (JP); Kouichi Nagai, Kawasaki (JP)

(73) Assignee: FUJITSU SEMICONDUCTOR LIMITED, Yokohama (JP)

( * ) Notice: Subject to any disclaimer, the term of this patent is extended or adjusted under 35 U.S.C. 154(b) by 0 days.

(21) Appl. No.: 14/532,311

(22) Filed: Nov. 4, 2014

(65) Prior Publication Data
US 2015/0054129 A1    Feb. 26, 2015

Related U.S. Application Data

(60) Division of application No. 13/293,628, filed on Nov. 10, 2011, now Pat. No. 8,906,705, which is a division of application No. 12/163,418, filed on Jun. 27, 2008, now Pat. No. 8,076,780, which is a continuation of application No. PCT/JP2005/023964, filed on Dec. 27, 2005.

(51) Int. Cl.
H01L 23/52       (2006.01)
H01L 27/115      (2006.01)
H01L 23/00       (2006.01)

(52) U.S. Cl.
CPC ........ H01L 27/11507 (2013.01); H01L 23/564 (2013.01); H01L 24/13 (2013.01);
(Continued)

(58) Field of Classification Search
None
See application file for complete search history.

(56) References Cited

U.S. PATENT DOCUMENTS 5,438,023 A    8/1995  Argos, Jr. et al.
5,523,595 A    6/1996  Takenaka et al.
(Continued)

FOREIGN PATENT DOCUMENTS

JP    61-005562 A    1/1986
JP    04-102367 A    4/1992
(Continued)

OTHER PUBLICATIONS

International Search Report of PCT/JP2005/023964, date of mailing Apr. 18, 2006.
(Continued)

Primary Examiner — Jack Chen
(74) Attorney, Agent, or Firm — Westerman, Hattori, Daniels & Adrian, LLP

(57) ABSTRACT

A semiconductor device is provided having a pad with an improved moisture blocking ability. The semiconductor device has: a circuit portion including a plurality of semiconductor elements formed on a semiconductor substrate; lamination of insulator covering the circuit portion, including a passivation film as an uppermost layer having openings; ferro-electric capacitors formed in the lamination of insulator; wiring structure formed in the lamination of insulator and connected to the semiconductor elements and the ferro-electric capacitors; pad electrodes connected to the wiring structure, formed in the lamination of insulator and exposed in the openings of the passivation film; a conductive pad protection film, including a Pd film, covering each pad electrode via the opening of the passivation film, and extending on the passivation film; and stud bump or bonding wire connected to the pad electrode via the conductive pad protection film.

11 Claims, 11 Drawing Sheets

(52) U.S. Cl.
CPC ...... *H01L 24/05* (2013.01); *H01L 2224/13023* (2013.01); *H01L 2224/13014* (2013.01); *H01L 2224/13144* (2013.01); *H01L 2224/0401* (2013.01); *H01L 2224/05083* (2013.01); *H01L 2224/05164* (2013.01); *H01L 2924/01013* (2013.01); *H01L 2924/01022* (2013.01); *H01L 2924/01007* (2013.01); *H01L 2224/05666* (2013.01)

(56) References Cited

U.S. PATENT DOCUMENTS

| | | | |
|---|---|---|---|
| 7,288,799 B2 * | 10/2007 | Saigoh et al. | 257/127 |
| 7,550,844 B2 | 6/2009 | Matsuki et al. | |
| 2002/0003305 A1 | 1/2002 | Umakoshi et al. | |
| 2002/0125577 A1 | 9/2002 | Komada | |
| 2005/0127395 A1 | 6/2005 | Saigoh et al. | |
| 2005/0151250 A1 | 7/2005 | Chiba et al. | |
| 2006/0091536 A1 | 5/2006 | Huang et al. | |

FOREIGN PATENT DOCUMENTS

| | | |
|---|---|---|
| JP | 08-055850 A | 2/1996 |
| JP | 08-064634 A | 3/1996 |
| JP | 10-247664 A | 9/1998 |
| JP | 2002-270608 | 9/2002 |
| JP | 2003-297869 | 10/2003 |
| JP | 2005-175204 A | 6/2005 |

OTHER PUBLICATIONS

Japanese Office Action dated Jan. 31, 2012, issued in corresponding Japanese Patent Application No. 2007-551841.

* cited by examiner

FIG. 2A
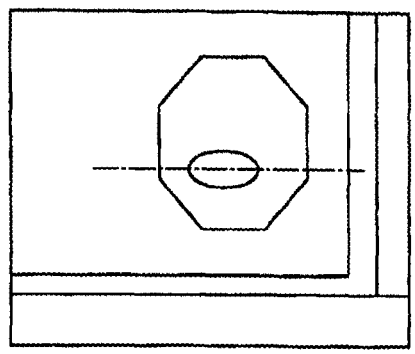
FIG. 2B
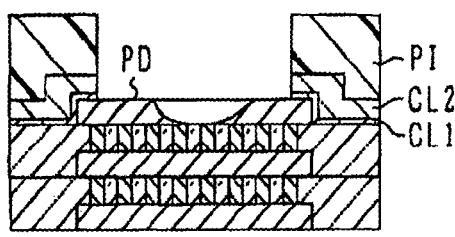
FIG. 2C
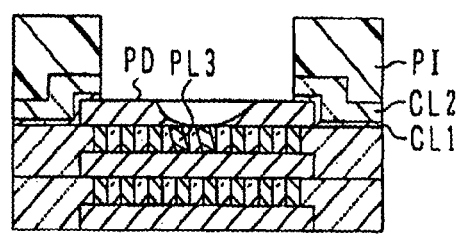
FIG. 2D
| STRUCTURE ON PADS AFTER INSPECTION | 168h | 264h | 504h | 528h |
|---|---|---|---|---|
| S1 : STUD BUMP | 11/18 | ... | 13/18 | ... |
| S2 : PLATED BUMP | 0/12 | 0/12 | ... | 0/12 |
|  | 0/77 | 0/77 | ... | ... |
| S3 : UBM FILM + STUD BUMP | 0/77 | 0/77 | ... | 0/77 |

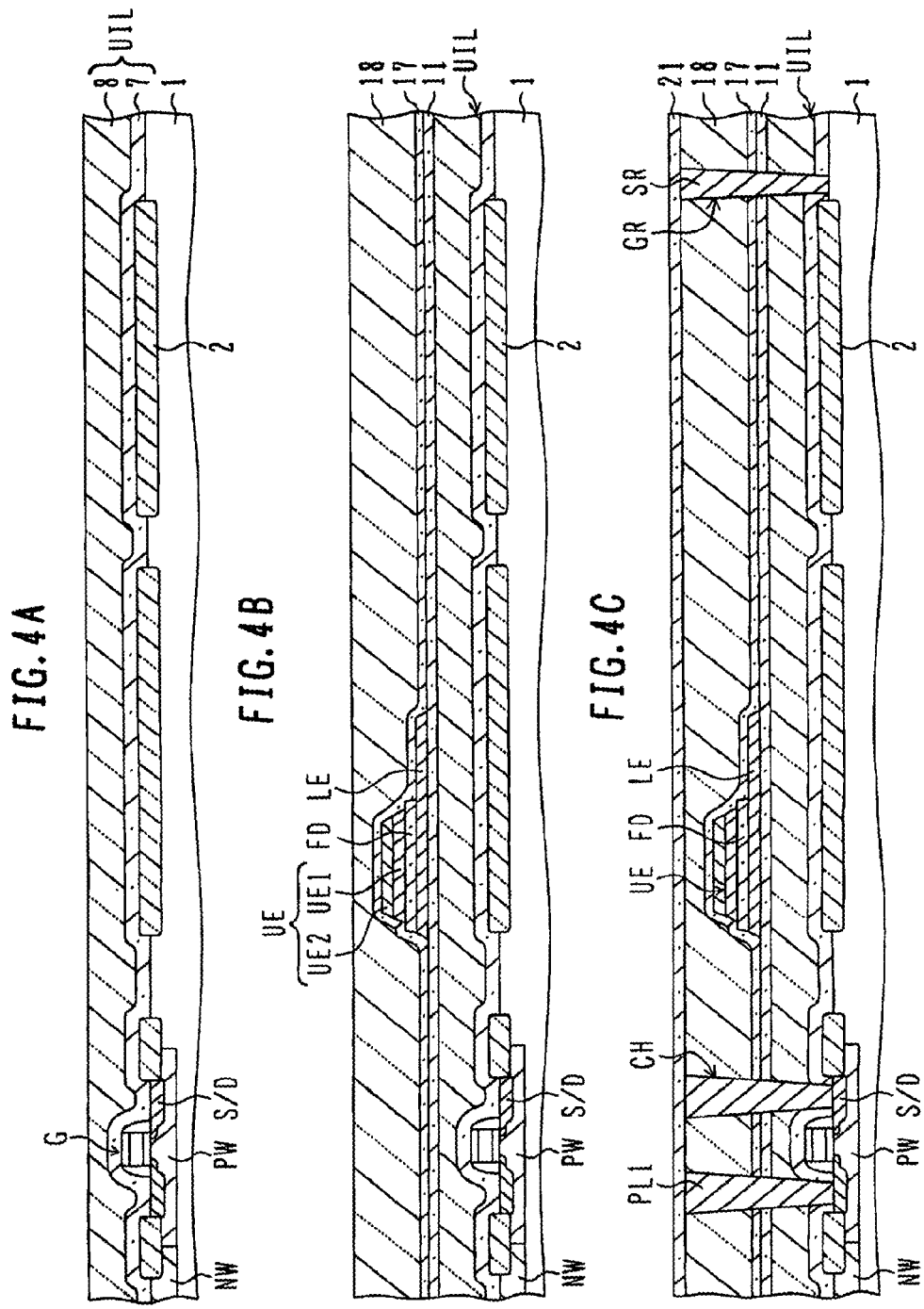

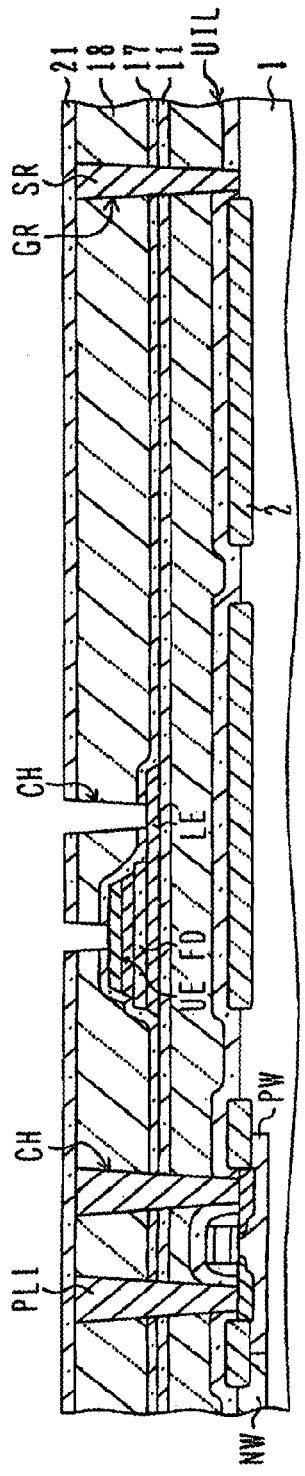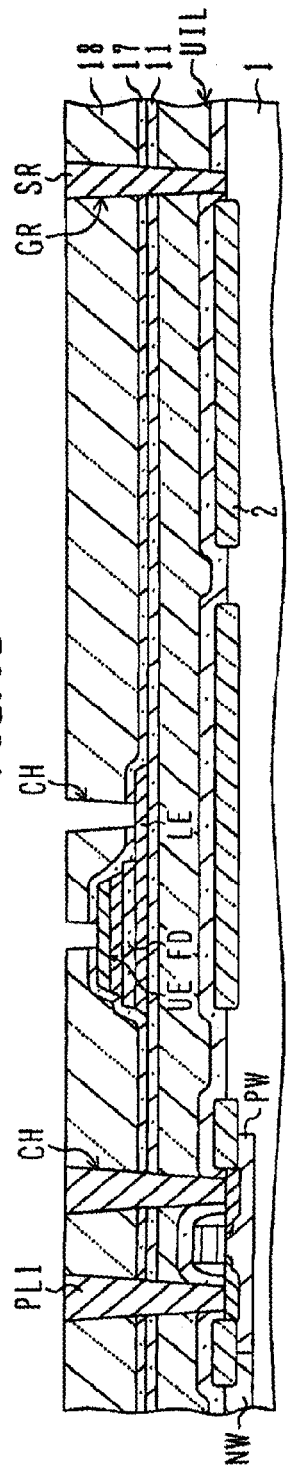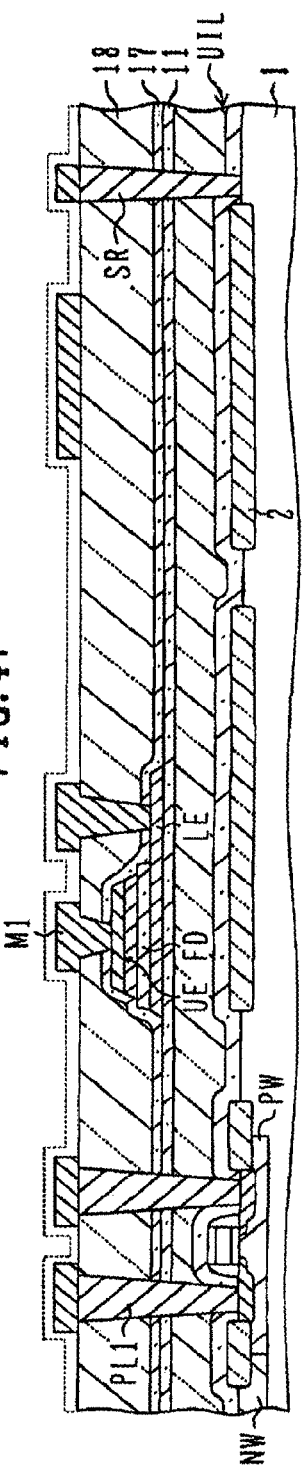

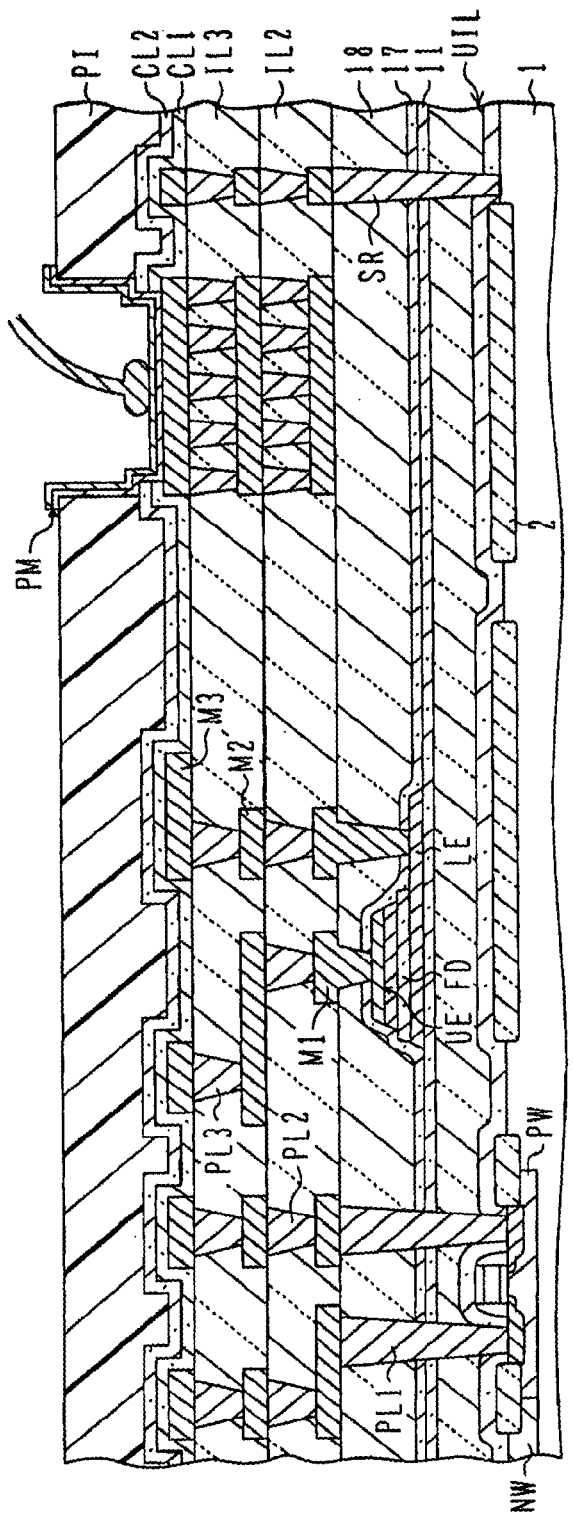
FIG. 4K1
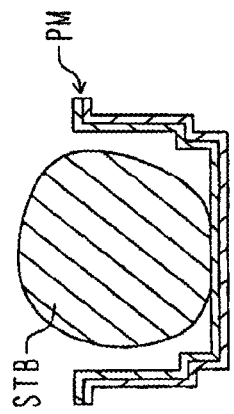
FIG. 4K2

SEMICONDUCTOR DEVICE WITH PADS OF ENHANCED MOISTURE BLOCKING ABILITY

CROSS REFERENCE TO RELATED APPLICATION

This application is divisional of U.S. application Ser. No. 13/293,628, filed Nov. 10, 2011, which is a divisional of U.S. application Ser. No. 12/163,418 filed Jun. 27, 2008, now U.S. Pat. No. 8,076,780 issued Dec. 13, 2011, which is a continuation application of an International Application, PCT/JP2005/23964, filed on Dec. 27, 2005, the entire contents of which are incorporated herein by reference.

BACKGROUND

A) Field

The embodiments discussed herein are directed to a semiconductor device, which may relate to a semiconductor device having pads for connection to an external circuit and for inspection.

B) Description of the Related Art

It is well known that as moisture permeates into a circuit region of a semiconductor integrated circuit device, the performance of the semiconductor integrated circuit device is degraded. An interlayer insulating film of the semiconductor integrated circuit device is often made of silicon oxide. Silicon oxide has a high affinity with moisture. In order to prevent permeation of moisture and hydrogen, a cover film having a moisture blocking function is formed on a multilayer wiring and a moisture blocking ring is formed along a peripheral edge of a semiconductor chip.

JP-A-2002-270608 (applicant: Fujitsu VLSI Ltd) proposes that in a semiconductor device having a damascene wiring structure burying a wiring pattern and via conductors in an interlayer insulating film, a moisture blocking ring extending along a peripheral edge of a chip is made of lamination of via rings formed in the same layers as those of the via conductors and wiring rings formed in the same layers as those of the wiring patterns.

JP-A-2005-175204 (applicant: Fujitsu Ltd) proposes that a first moisture blocking ring is disposed inside the pads and a second moisture blocking ring is disposed outside the pads. If a conductive moisture blocking ring is used, the first moisture blocking ring should be cut around wirings connected to the pads.

The development of ferro-electric memory (Fe RAM) is in progress which uses a ferro-electric capacitor and stores information by utilizing reversible polarization of ferro-electric material. A ferro-electric memory is a nonvolatile memory whose stored information will not be erased even if power supply is shut down, and is expected to realize high integration, high speed driving, high durability and low power consumption.

A ferro-electric memory stores information by utilizing hysteresis characteristics of ferro-electric material. A ferro-electric capacitor having a ferro-electric film as a capacitor dielectric film sandwiched between a pair of electrodes generates polarization corresponding to a voltage applied across the electrodes, and retains the polarization even after the applied voltage is removed. As the polarity of the applied voltage is reversed, the polarity of polarization is also reversed. By detecting this polarization, information can be read. As the material of the ferro-electric film, ferro-electric oxide material having a perovskite crystal structure is used mainly, such as PZT($Pb(Zr_{1-x}Ti_x)O_3$) and SBT($SrBi_2Ta_2O_9$) having a large polarization quantity, e.g., about 10 $\mu C/cm^2$ to 30 $\mu C/cm^2$. In order to form a ferro-electric oxide film having excellent characteristics, the film is required to be formed or to be subjected to heat treatment in an oxidizing atmosphere, and a lower electrode (also an upper electrode when necessary) is often made of noble metal hard to be oxidized, noble metal maintaining conductivity even if it is oxidized, or noble metal oxide.

As moisture permeates from external, moisture can reach wirings, capacitors, transistors and the like through the interlayer insulating film. As moisture reaches a capacitor particularly a ferro-electric capacitor, the characteristics of a dielectric film particularly a ferro-electric film are deteriorated. If the ferro-electric film is reduced by hydrogen derived from permeated moisture and oxygen defects are formed, crystallinity of the dielectric film becomes bad. The characteristics are deteriorated such as a reduced residual polarization quantity and a lowered dielectric constant. Similar phenomena occur by long term use. As hydrogen permeates, deterioration of the characteristics becomes more direct than moisture.

A semiconductor integrated circuit device has pads in the layer same as the uppermost wiring layer or above the uppermost wiring layer. Probe needles are abutted on the pads for inspection, or wires are bonded to the pads for connection to an external circuit. The pad has a relatively large size as compared to other wiring patterns, and the upper surface is exposed on which a probe needle is abutted or to which a connection wire for an external circuit is bonded. Until a semiconductor integrated circuit device is completed, a plurality of inspections are performed, and only the products judged good at a final stage is packaged. Pads for inspection and for external connection are required to be in an exposed state.

As a probe needle is abutted on a pad during inspection, the pad may have a crack. Scribe pad layout is known wherein bonding pads are disposed in a chip region, and inspection pads are disposed in a scribe region outside the chip region. Since inspection pads are cut off by a scribe process after inspections, the bonding pads will not have a crack. However, if the inspection pads are disposed in the scribe region together with alignment marks and test element group (TEG), the moisture blocking ring is required to be cut away around the wirings for interconnecting scribe pads with the chip circuit. It is desired not to use scribe pads because the moisture blocking ability will be lowered. According to another countermeasure, inspection pads and bonding pads are separately disposed in the chip region, and after inspections, the inspection pads are covered with a protection film. With this countermeasure, however, the number of pads in the chip region increases, hindering high integration.

There are strong demands for using a ferro-electric memory in a tag, a card and the like. For this application, a ferro-electric memory device is desired to be made much smaller.

SUMMARY

It is an aspect of the embodiments discussed herein to provide a semiconductor device including: a circuit portion including a plurality of semiconductor elements formed on a semiconductor substrate; lamination of insulator covering the circuit portion, formed on the semiconductor substrate and including a passivation film as an uppermost layer having an opening; a ferro-electric capacitor formed in the lamination of insulator; a wiring structure formed in the lamination of insulator and connected to the semiconductor elements and the ferro-electric capacitor; a pad electrode structure connected to the wiring structure, formed in the lamination of insulator and exposed in the opening of the passivation film; a conductive pad protection film including a Pd film, covering the pad electrode structure via the opening of the passivation film, and extending on the passivation film; and a stud bump or a bonding wire connected to the pad electrode structure via the conductive pad protection film.

These together with other aspects and advantages which will be subsequently apparent, reside in the details of construction and operation as more fully hereinafter described and claimed, reference being had to the accompanying drawings forming a part hereof, wherein like numerals refer to like parts throughout.

BRIEF DESCRIPTION OF THE DRAWINGS

FIGS. 2A to 2D are a plan view sketched from a photograph and cross sectional views of semiconductor chips explaining the progress of researches made by the present inventors, and a table showing the results of experiments.

FIGS. 4A to 4K1 and 4K2 are cross sectional views of a semiconductor substrate showing main precesses of a method for manufacturing the semiconductor device of the first embodiment.

DESCRIPTION OF THE PREFERRED EMBODIMENTS

First, description will be made on the progress of the researches made by the present inventors. In order to use a ferro-electric memory device in a tag, a conventionally adopted option of separating inspection pads and bonding pads was not considered worthwhile. Inspections were conducted using pads used for both inspection and bonding disposed inside a chip, stud bumps were connected to the pads after the inspections, and the chip was accommodated in a package.

Figure 1A:
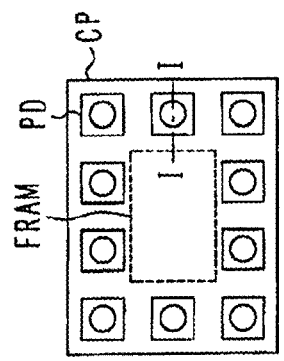
FIGS. 1A to 1D are a plan view and cross sectional views of semiconductor chips explaining the progress of researches made by the present inventors.

FIG. 1A is a schematic plan view showing a chip layout. A ferro-electric memory circuit FRAM is formed in a central area of a chip CP, and pads PD are disposed in a peripheral edge area of the chip CP. The surface of each pad is exposed in an opening formed through a polyimide film. In this state, inspections were conducted by abutting a probe needle on each pad PD.

Figure 1B:
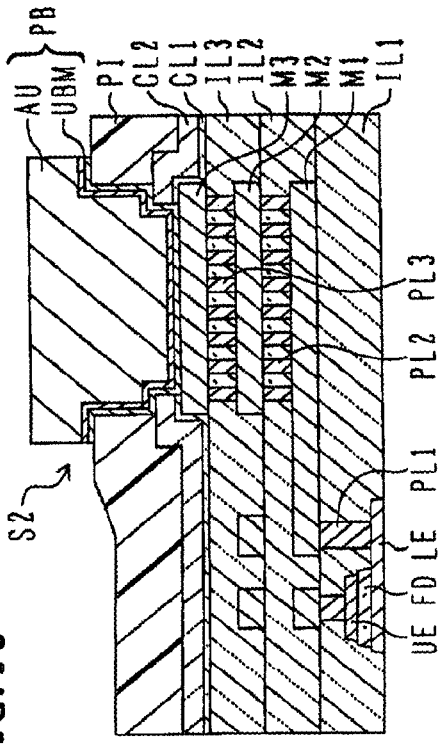

FIG. 1B is a schematic cross sectional view showing the structure of a sample S1 formed at the first stage. After transistors are formed, a lower interlayer insulating film is formed, and a ferro-electric capacitor is formed on the lower interlayer insulating film, the capacitor being made of a lamination of a lower electrode LE, a ferro-electric dielectric film FD and an upper electrode UE. A first interlayer insulating film IL1 of silicon oxide is formed covering the ferro-electric capacitor. Tungsten plugs PL1 are formed penetrating through the first interlayer insulating film IL1 and reaching the upper electrode UE and lower electrode LE. Other tungsten plugs are also formed reaching underlying transistors.

A first metal wiring M1 of Al-Cu alloy is formed on the first interlayer insulating film IL1, and is covered with a second interlayer insulating film IL2. Tungsten plugs PL2 are formed penetrating through the second interlayer insulating film IL2 and reaching the first metal wiring M1. In a similar manner, a second metal wiring M2, a third interlayer insulating film IL3 and tungsten plugs PL3 are formed. A third metal wiring M3 which forms a pad electrode PD is formed, while being connected to the underlying tungsten plugs. The surface of the pad of Al—Cu alloy is exposed. A cover film is formed covering the pad PD, the cover film being a lamination of a first cover film CL1 of silicon oxide and a second cover film CL2 of silicon nitride. An opening exposing the pad PD is formed through the cover film by etching. A photosensitive polyimide film PI is formed on the substrate surface, exposed and developed to expose the surface of the pad PD. After the passivation film is formed on the pad electrodes PD in this manner, inspections are conducted by abutting probe needles on the pads, and thereafter stud bumps SDB of gold (Au) are disposed on the pads PD.

This sample failed a moisture durability test. It has been found that the structure of the stud bump disposed on the pad has an insufficient moisture blocking ability.

Figure 1C:
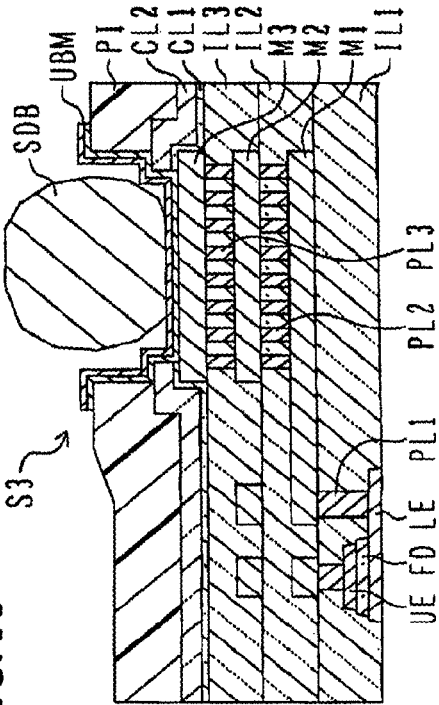

FIG. 1C shows the structure of a sample S2 forming a gold plated bump in place of a stud bump. Inspections were conducted after forming an opening through the cover films CL1 and CL2. After a passivation film PI was formed and patterned, an under-barrier metal film UBM was formed extending on the pad electrode PD and over the passivation film PI, and a gold layer AU was plated on the under-barrier metal UBM to form the plated bump PB. The under-barrier metal UBM is a lamination in that a Pd film of 175 nm thick is stacked on a Ti film of 175 nm thick. This sample passed the moisture durability test. Since the structure under UBM is similar to that of the sample S1, it can be known that the plated bump PD recovers the moisture blocking ability.

Figure 1D:
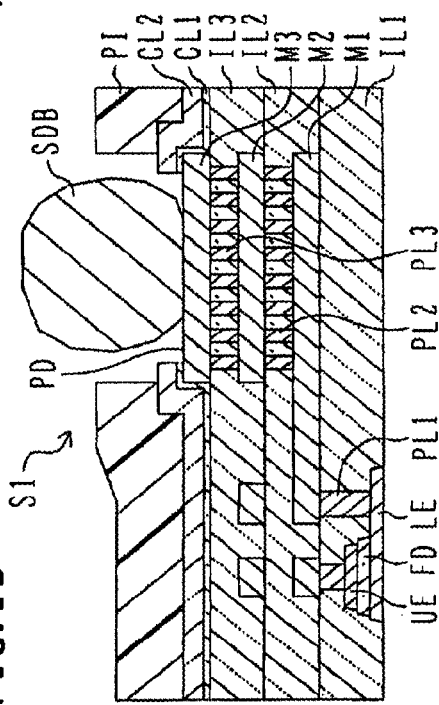

FIG. 1D shows the structure of a sample S3 manufactured by forming the layers up to the under-barrier metal UBM similar to the sample S2 and disposing a gold stud bump SDB without gold plating. The under-barrier metal UBM is a lamination that a Pd film of 175 nm thick is stacked on a Ti film of 175 nm thick. This sample also passed the moisture durability test.

FIG. 2A is a sketch of a pad surface after inspection. A flaw caused by abutment of a needle for inspection can be observed.

FIGS. 2B and 2C are schematic cross sectional views showing detailed observation results of flaws. FIG. 2B shows a defective flaw of the pad electrode PD. It can be considered that as the pad electrode PD becomes thin or lost, a moisture blocking ability is degraded and hydrogen and moisture are likely to be permeated.

FIG. 2C shows a situation wherein not only the pad electrode PD has a defective flaw, but also the underlying tungsten plugs PL3 fall to some extent.

FIG. 2D is a table collectively showing the results of moisture durability tests of the samples S1, S2 and S3. The moisture durability test was conducted under the conditions of a temperature of 121° C. and a humidity of 85%. The occurrence number of failures is indicated by a ratio of failures to the number of samples, after 168 hours, 264 hours, 504 hours and 528 hours. The sample S1 has a failure occurrence number of 11/18 near 2/3 after 168 hours, and 13/18 in excess of 2/3 after 504 hours. Two groups were formed for the sample S2. Twelve samples of the first group had a failure occurrence number of 0/12 for each of after 168 hours, after 264 hours, and after 528 hours. Seventy seven samples of the second group had a failure occurrence number of 0/77 for each of after 168 hours and after 264 hours.

Seventy seven samples of the third sample S3 had a failure occurrence number of 0/77 for each of after 168 hours, after 264 hours, and after 528 hours. The sample S3 had the same moisture blocking ability as that of the sample S2 so long as an experiment measurement precision is concerned. The experiment results of the sample S1 suggest that the gold stud bump has no function of recovering from moisture blocking ability degradation caused by a pad flaw. Recovery of the moisture blocking ability of sample S3 may be ascribed to the under-barrier metal other than the stud bump.

It can be considered from these results that the moisture blocking ability can be recovered by forming the Ti/Pd lamination above the flaws D even if the flaws such as shown in FIGS. 2B and 2C are formed. Although the Ti/Pd lamination is often used as an under-barrier film for plating or the like, plating is not performed for the sample S3. It can therefore be considered that the Ti/Pd lamination has a pad protective function of recovering the moisture blocking function different from the function of serving as the underlying film of a plated film.

It is known that of the Ti/Pd film, the Ti film has a function of reinforcing adhesion between upper and lower films and the Pd film has a property of absorbing hydrogen. If adhesion is guaranteed, it can be expected that a similar moisture blocking ability recovery function is exhibited even if only the Pd film is formed. It can be considered that the moisture blocking ability can be recovered if a conductive pad protection film is formed on the pad used for the inspection. It can also be considered that the moisture blocking ability can be retained even while a bonding wire is bonded to the pad. It is known that a Ti film, a Ti/TiN lamination and a Ti/Ti—Al—N lamination have similar properties. A TiN film or a Ti—Al—N film may therefore be inserted between the Ti film and Pd film. Embodiments will now be described in the following.

Figure 3A:
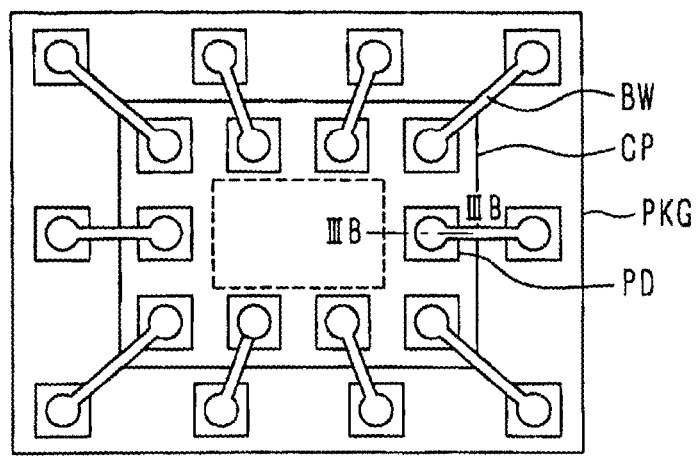
FIGS. 3A and 3B are a plan view and a cross sectional view schematically showing a semiconductor device according to a first embodiment.
Figure 3B:
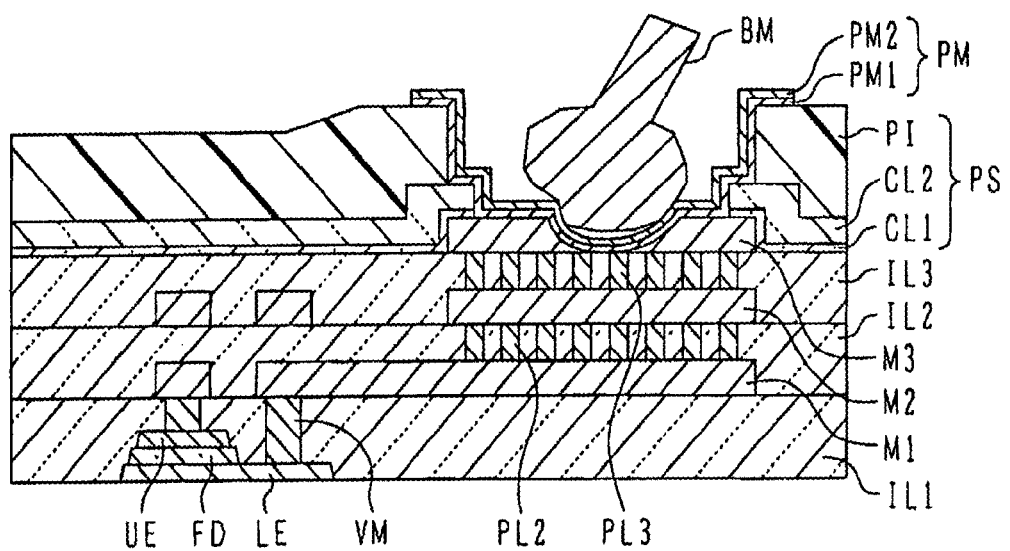

FIGS. 3A and 3B are a schematic plan view and a partial cross sectional view of a packaged semiconductor device according to the first embodiment.

As shown in FIG. 3A, a semiconductor chip CP including a ferro-electric memory is accommodated in a package PKG. Pads PD of the chip CP are wire-bonded to leads or the like of the package PKG by bonding wires BW. FIG. 3B is a partial cross sectional view taken along line IIIB-IIIB in FIG. 3A. A first interlayer insulating film IL1 is formed covering a ferro-electric capacitor constituted of a lower electrode LE, a ferro-electric dielectric film FD and an upper electrode UE. Via metals VM are formed penetrating through the first interlayer insulating film IL1 from the upper surface thereof and reaching the upper electrode UE and lower electrode LE of the ferro-electric capacitor. A first metal wiring M1 of aluminum or the like is formed on the first interlayer insulating film IL1, and is covered with a second interlayer insulating film IL2. Contact holes penetrating through the second interlayer insulating film IL2 and reaching the first metal wiring M1 are formed, and conductive plugs PL2 of tungsten or the like are buried in the contact holes. By similar processes as above, a second metal wiring M2 and a third interlayer insulating film IL3 are formed, and conductive plugs PL3 are buried. A pad electrode M3 of aluminum or the like is formed on the third interlayer insulating film IL3. A first cover film CL1 of silicon oxide or the like is deposited, and a second cover layer CL2 of silicon nitride or the like having a moisture/hydrogen blocking ability is deposited thereon. An opening for exposing each of the pad electrodes is formed. In this state, a needle is abutted on the pad to perform inspection. After the inspection, a polyimide film Pl or an epoxy film is formed on the substrate surface, and an opening exposing the pad is formed.

A first conductive pad protection film PM1 of Ti is deposited, and a second conductive pad protection film PM2 of Pd is deposited on the first conductive pad protection film, to thereby form a conductive pad protection film PM. The conductive pad protection film PM is patterned in a shape covering the pad electrode and partially extending on the polyimide film. Even if the pad electrode M3 has a flaw caused by abutment of the needle, the conductive pad protection film PM covers the flaw surface and recovers the moisture blocking ability. A bonding wire BW of Al or the like is wire-bonded to the conductive pad protection film PM. Instead of the bonding wire, a stud bump such as shown in FIG. 1D may be connected.

FIGS. 4A to 4K are cross sectional views illustrating main processes of a method for manufacturing the semiconductor device of the first embodiment.

As shown in FIG. 4A, in the surface layer of a semiconductor substrate 1 made of, e.g., a silicon substrate, n-type wells NW and p-type wells PW necessary for forming a circuit structure are formed, and an isolation region 2 surrounding these active regions is formed. In the structure shown in FIG. 4A, although the isolation region 2 is formed by local oxidation of silicon (LOCOS), the isolation region may be formed by shallow trench isolation (STI). An insulated gate electrode G is formed on the active region, and source/drain regions S/D are formed on both sides of the gate electrode.

A lower interlayer insulating film UIL is formed on the semiconductor substrate, covering the semiconductor elements such as MOS transistors. For example, the lower interlayer insulating film UIL is a lamination of a silicon oxynitride film 7 and a silicon oxide film 8. First, a lamination is formed by plasma CVD, including a silicon nitride film 7 in a thickness range of 50 15 to 250 nm, e.g., about 200 nm thick and a silicon oxide film 8 having a thickness including a polishing margin. The silicon oxynitride film has a barrier function for moisture and hydrogen, and prevents the characteristics of MOS transistor from being deteriorated. The silicon oxide film is, for example, a non-doped silicate glass (NSG) film formed by plasma CVD using TEOS as a Si source. The silicon oxide film having a thickness of, e.g., 600 nm is formed and polished by about 200 nm thick by chemical mechanical polishing (CMP) to planarize the surface thereof. A silicon oxide film is further formed on the planarized surface to a thickness of about 100 nm by plasma CVD using TEOS as a Si source. Thereafter, a degassing process is executed, for example, about 30 minutes at 650° C. in a nitrogen atmosphere.

As shown in FIG. 4B, an alumina film 11 is formed on the silicon oxide film 8 to a thickness of, e.g., about 20 nm by physical vapor deposition (PVD) such as sputtering. The alumina film has a strong function of shielding moisture and hydrogen. After the alumina film 11 is formed, heat treatment is performed, for example, for about 60 seconds at 650° in an oxygen atmosphere, by rapid thermal annealing (RTA). With this heat treatment, the film quality of the alumina film 11 is improved. The alumina film 11 may also be considered as a part of the lower interlayer insulating film.

A lamination of a lower electrode LE, a ferro-electric dielectric layer FD and an upper electrode UE of a ferro-electric capacitor is formed on the alumina film 11. For the lower electrode LE, for example, a Pt film having a thickness of 155 nm is formed by PVD. For the ferro-electric dielectric film FD, for example, a PZT film having a thickness of 150 to 200 nm is formed by PVD. After the ferro-electric dielectric film FD is formed, an annealing process is performed for 90 seconds at 585° C. in an $O_2$ atmosphere (flow rate of 0.025 litter/minute), for example, by RTA, to improve the film quality of the PZT film.

On the ferro-electric dielectric film FD, for example, an $IrO_2$ film having a thickness of 50 nm is formed as a first upper electrode UE1. After the first upper electrode UE1 is formed, an annealing process is performed for 20 seconds at 725° C. in an $O_2$ atmosphere (flow rate of 0.025 litter/minute), for example, by RTA, to crystallize the first upper electrode UE1. Thereafter, an $IrO_2$ film having a thickness of about 200 nm is formed as a second upper electrode UE2, for example, by PVD. The first and second upper electrodes UE1 and UE2 constitute the upper electrode UE.

After the lamination structure for forming a ferro-electric capacitor structure is deposited, the upper electrode UE is etched by using a photoresist pattern as an etching mask. After the etching, the photoresist pattern is removed. For recovery annealing of the PZT film, heat treatment is performed, for example, for 60 minutes at 650° C. in an $O_2$ atmosphere (flow rate of 20 litter/minute), for example, in a vertical furnace. Another photoresist pattern is formed to etch the PZT film. After the etching, for recovery of the PZT film, annealing is performed, for example, for 60 minutes at 350° C. in an $O_2$ atmosphere (flow rate of 20 litter/minute), for example, in a vertical furnace.

For example, an alumina film having a thickness of 50 nm is formed on the whole semiconductor substrate surface by PVD, covering the patterned upper electrode UE and ferro-electric dielectric film FD. After the alumina film is formed, heat treatment is performed, for example, for 60 minutes at 550° C. in an $O_2$ atmosphere (flow rate of 20 litter/minute) in a vertical furnace to thereby improve the film quality of the alumina film. By using a photoresist pattern formed on the alumina film as an etching mask, the alumina film and lower electrode LE are etched. After the lower electrode LE is etched, recovery annealing of the PZT film is performed in a manner similar to that described above, for example, for 60 minutes at 650° C. in an $O_2$ atmosphere (flow rate of 20 litter/minute).

An alumina film having a thickness of about 50 nm is further formed, for example, by PVD, covering the patterned ferro-electric capacitor. This alumina film and the previously formed alumina film are collectively called an alumina film 17. After the alumina film 17 is formed, heat treatment is performed in a manner similar to that described above, i.e., for 60 minutes at 550° C. in an $O_2$ atmosphere (flow rate of 20 litter/minute) to improve the film quality of the alumina film. Thereafter, a silicon oxide film 18 is formed on the whole semiconductor substrate surface to a thickness of, e.g., 1500 nm by plasma CVD using TEOS as a Si source, covering the alumina film 17. Thereafter, the surface is planarized by CMP. Annealing in $N_2O$ plasm is performed, for example, for 2 minutes at 350° C. to nitridize the surface of the silicon oxide film 18.

As shown in FIG. 4C, a resist pattern having a contact hole CH pattern is formed on the semiconductor substrate, and the silicon oxide film 18, alumina films 17 and 11 and lower interlayer insulating film UIL are etched to expose the surfaces of active regions (source/drain regions). In the chip peripheral edge portion, a groove GR of a loop shape is formed reaching the semiconductor substrate.

After the contact holes CH are formed, the resist pattern is removed, and for example, a Ti film having a thickness of 20 nm is first deposited and then a TiN film having a thickness of 50 nm is deposited, by PVD. A W film having a thickness of 500 nm is further deposited by CVD. In this manner, the contact holes and groove GR are filled with these films. CMP is performed to remove the conductive films other than those in the contact holes and groove. In this manner, the tungsten film and the like deposited on the surface of the silicon oxide film 18 are removed by polishing. The tungsten plugs PL1 are therefore formed in the circuit portion, and the seal ring SR is formed in the chip peripheral end portion.

In order to nitridize the exposed surface of the silicon oxide film 18, plasma annealing is performed, for example, for 2 minutes at 350° C. in $N_2O$ plasma, etc. Next, a silicon oxynitride film 21 is deposited to a thickness of about 100 nm by CVD. The plasma annealing can be performed in a plasma CVD system for forming the SiON film 21, before the SiON film is formed. The silicon oxynitride film 21 is a protection film for protecting the surface of the W plugs from oxidation.

As shown in FIG. 4D, by using a resist pattern as an etching mask, contact holes CH are formed through the silicon oxynitride film 21, silicon oxide film 18, and alumina films 17 reaching the upper electrode UE and lower electrode LE of the ferro-electric capacitor. After the contact holes are formed by etching, heat treatment is performed under the conditions of 60 minutes at 500° C. in an $O_2$ atmosphere (flow rate of 20 litter/minute), for example, in a vertical furnace to thereby recover damages received at the PZT film. The silicon oxynitride film 21 protects the W plugs PL1 from oxidation during the heat treatment in the $O_2$ atmosphere.

As shown in FIG. 4E, the silicon oxynitride film 21 having finished its role is removed, for example, by etch-back.

As shown in FIG. 4F, for example, a TiN film having a thickness of 150 nm, an Al—Cu alloy film having a thickness of 550 nm and a TiN film having a thickness of 150 nm are laminated, for example, by PVD to thereby form a first metal wiring film burying the contact holes CH. The first metal wiring layer is etched by using a resist pattern to form first metal wirings M1. In this process, in addition to the first metal wirings M1 in the circuit portion, a pad pattern is formed in the portion where a pad structure is to be formed, and a seal ring is formed in the chip peripheral edge portion. The processes up to this process are well-known processes of forming a ferro-electric memory device. Other well-known processes may also be used.

After the first metal wirings M1 are patterned, heat treatment is performed in a vertical furnace, for example, for 30 minutes at 350° C. in an $N_2$ atmosphere (flow rate of 20 litter/minute). An alumina film having a thickness of, e.g., 20 nm may be formed by PVD, covering the first metal wiring pattern. By covering the bottom surface of the ferro-electric capacitor with the alumina film 11 and the top side surfaces with the alumina film 17 and by disposing the alumina film above the ferro-electric capacitor, it is possible to suppress moisture and hydrogen from permeating into the ferro-electric dielectric film from an external.

Figure 4G:
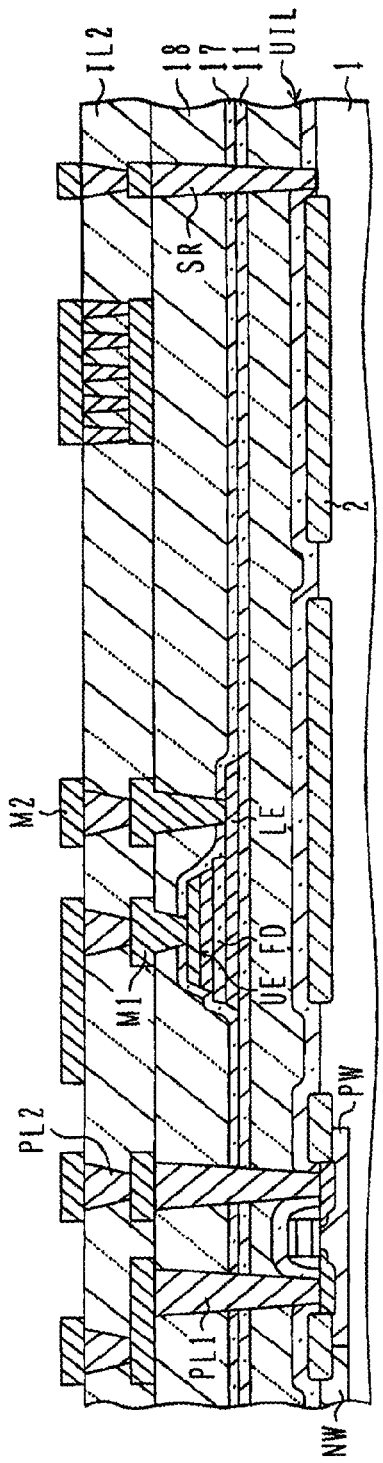

As shown in FIG. 4G, a silicon oxide film is formed to a thickness of about 2600 nm by CVD using TEOS as a source, covering the first metal wirings M1. The surface of the silicon oxide film is planarized and nitridized by plasma annealing similar to that described above. Another silicon oxide film is further formed to a thickness of about 100 nm by CVD using TEOS as a source. In order to nitridize the surface of this silicon oxide film, plasma annealing is performed. After a second interlayer insulating film IL2 is formed in this manner, a resist pattern is formed, and contact holes for connection to the first metal wirings M1 and a groove are formed by etching.

For example, a Ti film of about 50 nm thick is deposited by PVD and a W film of about 650 nm thick is deposited by CVD to form a Ti film and tungsten film burying the contact holes and groove. The W film and the like deposited on the upper surface of the interlayer insulating film IL1 are removed by etch-back or CMP. In this manner, second tungsten plugs PL2 are formed. Second metal wirings M2 are formed on the tungsten plugs PL2. Connection plugs and a pad electrode are formed in a pad structure portion, and a seal ring and a wiring ring are formed in the chip peripheral edge portion.

Figure 4H:
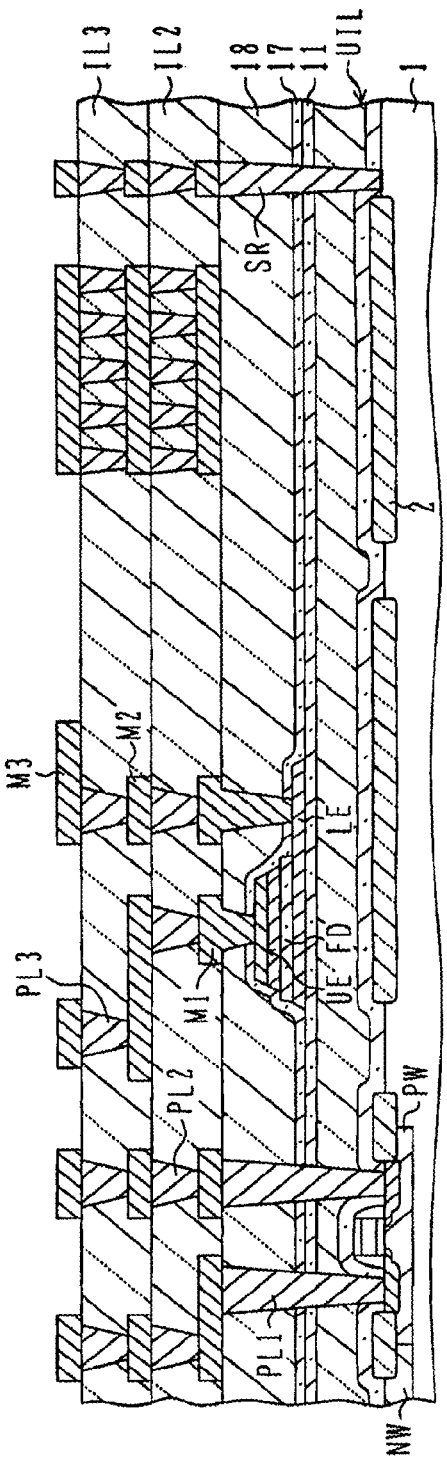

As shown in FIG. 4H, a TEOS silicon oxide film is deposited to a thickness of, e.g., 2200 nm, covering the second metal wiring pattern M2, CMP is performed for planarization, and then plasma annealing is performed to nitridize the surface thereof. A TEOS silicon oxide film is further deposited to a thickness of about 100 nm, and then plasma annealing is performed to nitridize the surface thereof. In this manner, a third interlayer insulating film IL3 is formed.

By a process similar to that described above, tungsten plugs PL3 are buried in the third interlayer insulating film IL3. Connection plugs are formed in the pad structure portion, and a seal ring is formed in the chip peripheral edge portion. Further, third metal wirings M3 are formed being connected to the tungsten plugs PL3 and the like. Therefore, a pad pattern is formed in the pad structure portion, and a wiring ring is formed in the chip peripheral edge portion.

Figure 4I:
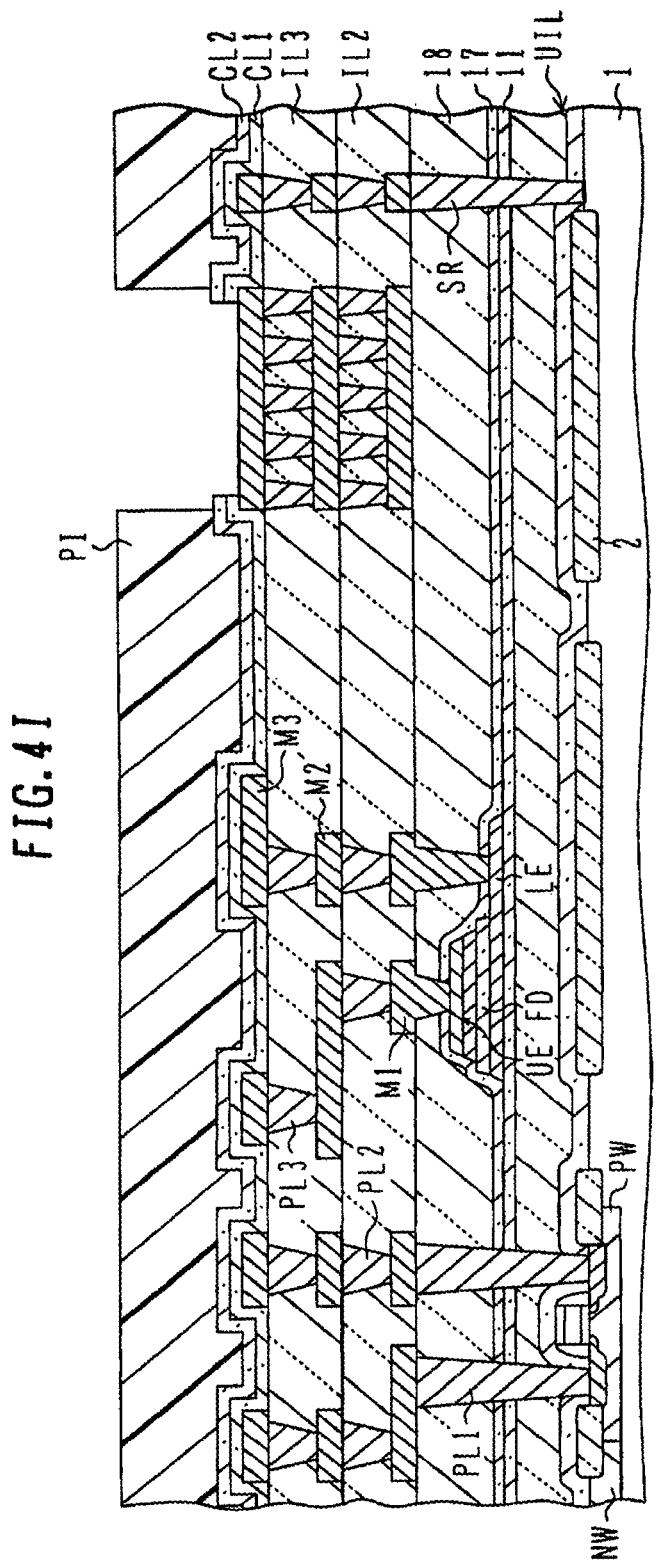

As shown in FIG. 4I, a first cover film CL1 of a TEOS silicon oxide film is deposited by CVD to a thickness of, e.g., about 100 nm, covering the multilayer wirings, and the surface thereof is nitridized by plasma annealing. A second cover film CL2 of a silicon nitride film is deposited on the first cover film to a thickness of, e.g., about 350 nm by plasma CVD.

By using a resist pattern, the silicon nitride film CL2 and silicon oxide film CL1 are etched. The upper TiN layer of the third metal wiring pattern is also etched at the same time. In this manner, the bonding pad having an aluminum (alloy) surface is exposed. In this state, a needle is abutted on the pad to perform inspection. The pad electrode may have damages such as shown in FIGS. 2A to 2C. The pad having damages lowers the moisture blocking ability.

A photosensitive polyimide layer is coated on the silicon nitride film CL2, exposed and developed to remove the polyimide layer in the bonding pad region. After the polyimide pattern PI is formed, a heating process is executed for 40 minutes at 310° C. in an $N_2$ atmosphere (flow rate of 100 litter/minute), for example, in a vertical furnace to thereby cure polyimide. Performing inspection prior to coating the polyimide film is effective for reducing the size of a conductive pad protection film to be later formed.

Figure 4J:
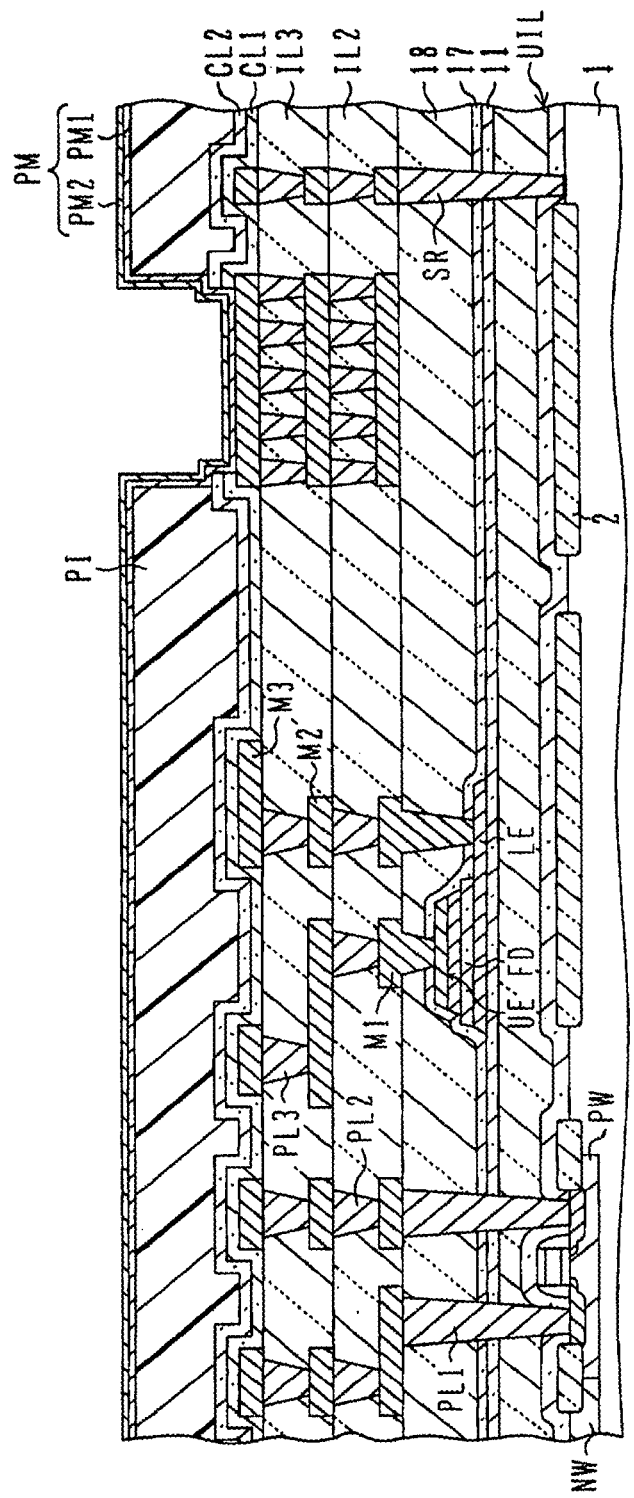

As shown in FIG. 4J, on the whole semiconductor substrate surface, a first conductive protection film PM1 of a Ti film having a thickness of 150 to 200 nm and a second conductive protection film PM2 of a Pd film having a thickness of 150 to 200 nm are deposited to thereby form a conductive pad protection film PM on the pad. If the pad has a flaw, the conductive pad protection film PM covers the flaw surface so that the moisture blocking ability can be recovered. In this state, all pads are electrically shorted.

As shown in FIG. 4K1, the conductive pad protection film is patterned to make the conductive pad protection film of each pad has a shape crawling or climbing up from the pad surface to the surrounding passivation film and electrically separating each pad. The Pd film can be etched by immersing the substrate for 9 minutes in mixture liquid of ammoniodide, iodine, ethyl alcohol and pure water. An etch rate was about 92.5 nm/minute. The Ti film can be etched by immersing the substrate for 9 minutes in mixture liquid of ethylenediaminetetraacetic (EDTA), ammonia, aqueous solution of hydrogen peroxide and pure water. An etch rate was about 38 nm/minute. The chip was accommodated in a package, one end of a bonding wire BM is bonded to the conductive pad protection film on the pad, and the other end is bonded to a lead, a pad, a land or the like.

As shown in FIG. 4K2, a stud bump SDB similar to that of the sample S3 shown in FIG. 1D may be connected to the conductive pad protection film. The stud bump SDB can be formed by gold or the like.

Figure 5A:
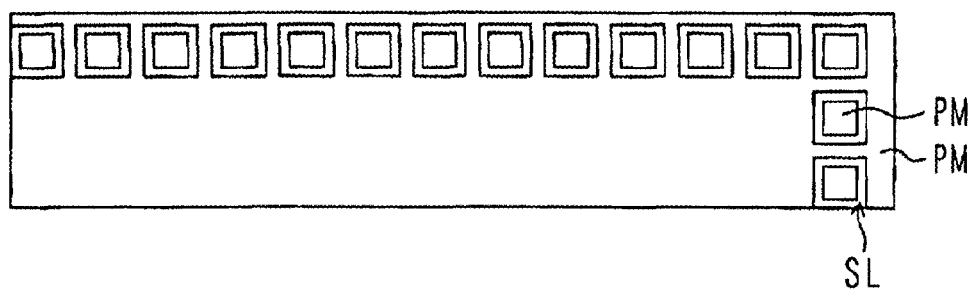
FIGS. 5A and 5B are a plan view and a cross sectional view of a semiconductor device according to a second embodiment.
Figure 5B:
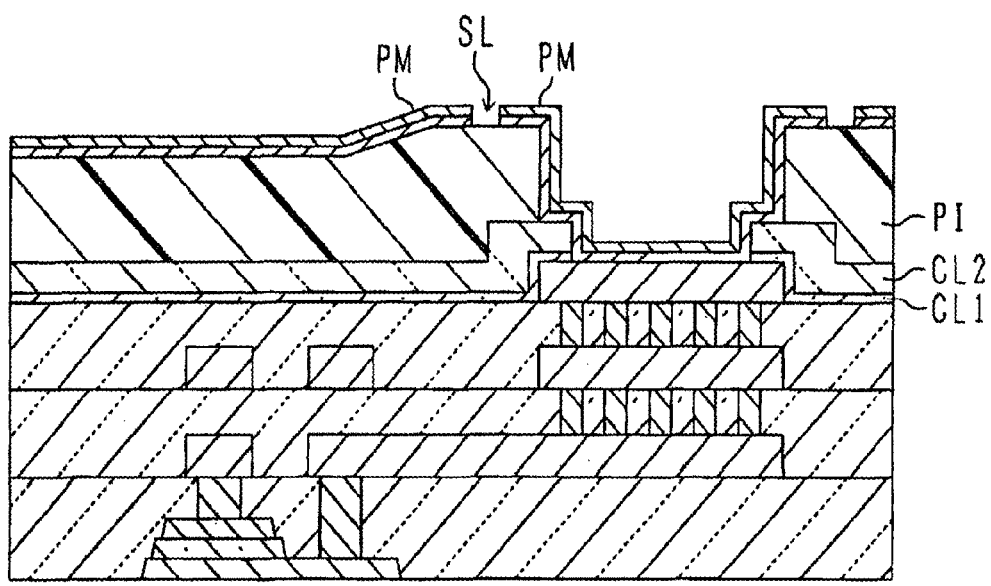

FIGS. 5A and 5B show a semiconductor device according to the second embodiment. FIG. 5A is a plan view and FIG. 5B is a cross sectional view. The processes shown in FIGS. 4A to 4J are performed in the manner similar to the first embodiment to deposit the conductive protection film PM. The conductive protection film is not left only in the pad portion, but a slit is formed in the conductive protection film at the peripheral area of each pad to electrically separate each pad PD. The chip surface other than the slit SL is covered with the conductive protection film PM. Moisture and hydrogen are difficult to permeate in the passivation film. A bonding wire or a stud bump is connected to the conductive pad protection film.

Figure 6:
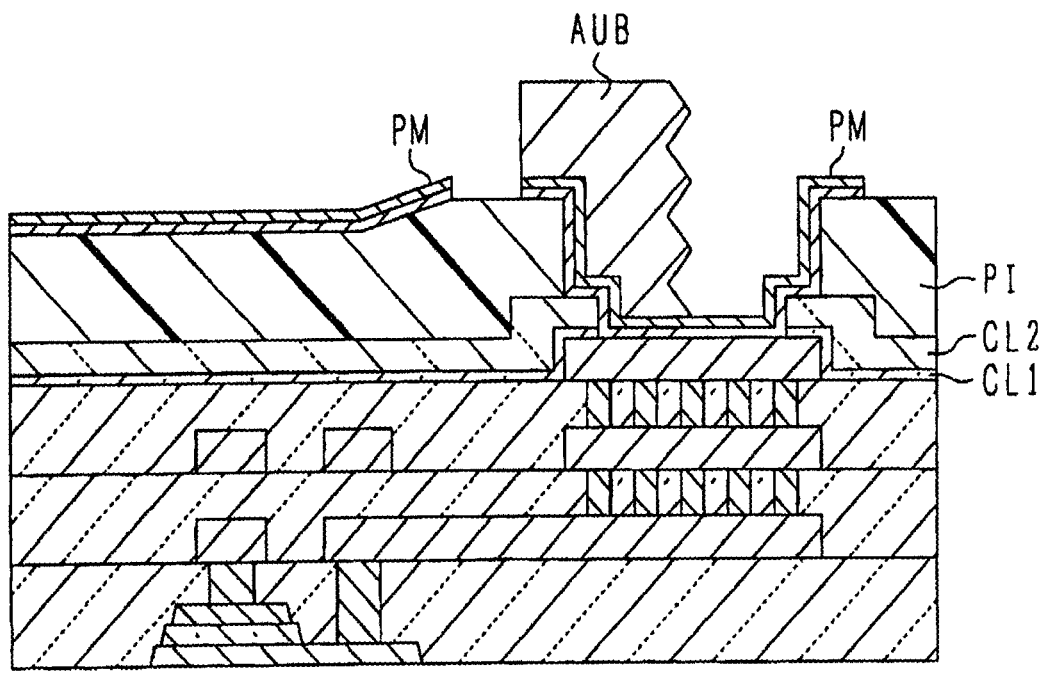
FIG. 6 is a cross sectional view of a semiconductor device according to a third embodiment.

FIG. 6 shows a semiconductor device according to the third embodiment. The processes shown in FIGS. 4A to 4J are performed in the manner similar to the first embodiment to deposit the conductive protection film PM. The conductive protection film PM is selectively etched to leave the film in an area covering the pad and in an area covering an upper region of the ferro-electric capacitor.

Gold plating is performed on the conductive protection film on the pad to form a gold bump AUB.

The shape of the conductive protection film PM left in the area other than the pad may be selected as desired. For example, the conductive protection film may be separated by slits such as shown in FIGS. 5A and 5B.

The present invention has been described in connection with the preferred embodiments. The invention is not limited only to the above embodiments. For example, thicknesses of the Ti film and Pd film of the conductive protection film can be changed depending on various conditions if a sufficient moisture blocking ability is retained. The pad may be formed having the uppermost surface of aluminum or aluminum alloy. Although alumina is used as the material of the insulating barrier layer having a function of shielding moisture and hydrogen, titanium oxide may be used in a similar manner. A thickness thereof is preferably 20 to 100 nm. It will be apparent to those skilled in the art that other various modifications, improvements, combinations, and the like can be made.

What are claimed are:

1. A semiconductor device comprising:
   a semiconductor substrate;
   a circuit portion including a plurality of semiconductor elements formed on said semiconductor substrate;
   lamination of insulator covering said circuit portion, formed on said semiconductor substrate and including a passivation film as an uppermost layer having an opening;
   a ferro-electric capacitor formed in said lamination of insulator;
   a wiring structure formed in said lamination of insulator and connected to said semiconductor elements and said ferro-electric capacitor;
   a pad electrode structure connected to said wiring structure, formed in said lamination of insulator and exposed in the opening of said passivation film;

a conductive pad protection film including a Pd film, covering said pad electrode structure via the opening of said passivation film, and extending on said passivation film; and a conductive capacitor protection film made of a same film as said conductive pad protection film and extending on said passivation film in an area including an area above said ferro-electric capacitor in a state electrically separated from said conductive pad protection film.

2. The semiconductor device according to claim 1, wherein said conductive capacitor protection film is electrically separated from said conductive pad protection film by a slit.

3. The semiconductor device according to claim 1, wherein said pad electrode structure has an uppermost surface of aluminum or aluminum alloy, and said uppermost surface has a flaw formed by needle abutment.

4. The semiconductor device according to claim 3, wherein said conductive pad protection film covers a surface of said flaw.

5. The semiconductor device according to claim 4, wherein said conductive pad protection film includes a Ti film contacting said uppermost surface of aluminum or aluminum alloy.

6. The semiconductor device according to claim 5, wherein said conductive pad protection film includes a TiN film or a Ti—Al—N film between said Pd film and said Ti film.

7. The semiconductor device according to claim 1, further comprising a plated bump formed on said conductive pad protection film.

8. The semiconductor device according to claim 7, wherein said plated bump is made of gold.

9. The semiconductor device according to claim 7, wherein said pad electrode structure has an uppermost surface of aluminum or aluminum alloy, and said uppermost surface has a flaw formed by needle abutment.

10. The semiconductor device according to claim 7, wherein said conducive pad protection film covers the surface of said flaw.

11. The semiconductor device according to claim 10, wherein said conductive pad protection film includes a Ti film contacting said uppermost surface of aluminum or aluminum alloy.

* * * * *